United States Patent [19]
Fazio et al.

[11] Patent Number: 5,402,370
[45] Date of Patent: Mar. 28, 1995

[54] CIRCUITRY AND METHOD FOR SELECTING A DRAIN PROGRAMMING VOLTAGE FOR A NONVOLATILE MEMORY

[75] Inventors: Albert Fazio, Los Gatos; Gregory E. Atwood, San Jose; James Brennan, Jr., Saratoga; Marc E. Landgraf, Folsom, all of Calif.

[73] Assignee: Intel Corporation, Santa Clara, Calif.

[21] Appl. No.: 119,738

[22] Filed: Sep. 10, 1993

[51] Int. Cl.$^6$ .............................................. G11C 7/00
[52] U.S. Cl. ................................ 365/185; 365/218; 365/189.09
[58] Field of Search ............... 365/185, 218, 201, 900, 365/189.09, 184

[56] References Cited
U.S. PATENT DOCUMENTS

| | | | |
|---|---|---|---|
| 5,163,021 | 11/1992 | Mehrotra et al. | 365/185 |
| 5,172,338 | 12/1992 | Mehrotra et al. | 365/185 |
| 5,218,571 | 6/1993 | Norris | 365/185 |
| 5,253,201 | 10/1993 | Atsumi et al. | 365/185 |
| 5,293,344 | 3/1994 | Akaogi . | |

Primary Examiner—Joseph A. Popek
Assistant Examiner—Vu Le
Attorney, Agent, or Firm—Blakely, Sokoloff, Taylor & Zafman

[57] ABSTRACT

A nonvolatile memory residing on a single substrate is described. The nonvolatile memory includes a memory array having at least a memory cell. The memory cell includes a drain region, a source region, a control gate, and a floating gate. A drain programming voltage generation circuit is coupled to a programming voltage source and the drain region of the memory cell for providing a drain programming voltage to the drain region of the memory cell during programming of the memory cell. A control circuit is coupled to the drain programming voltage generation circuit for causing the drain programming voltage to vary with respect to a programming ability of the memory cell such that the memory cell is programmed to be within a predetermined range of a predetermined threshold voltage with a predetermined gate programming voltage for a predetermined programming time. A method for setting the drain programming voltage for the nonvolatile memory such that the drain programming voltage varies inversely with respect to the programming ability of the nonvolatile memory is also described.

16 Claims, 13 Drawing Sheets

CIRCUITRY AND METHOD FOR SELECTING A DRAIN PROGRAMMING VOLTAGE FOR A NONVOLATILE MEMORY

FIELD OF THE INVENTION

The present invention pertains to the field of computer memories. More particularly, this invention relates to circuitry and a method for selecting a drain programming voltage for a floating gate nonvolatile memory in order to compensate for differences in programming ability.

BACKGROUND OF THE INVENTION

At least one type of prior flash erasable and electrically programmable read-only memory ("flash EPROM") uses memory cells that include electrically isolated gates, which are referred to as floating gates. Information is stored in the memory cells in the form of charge on the floating gates. FIG. 1 illustrates the structure of one memory cell 10 used in one type of prior flash EPROM. Memory cell 10 includes a drain region 13 and a source region 14 in a substrate 15. Source region 14 and drain region 13 are asymmetrically doped with an arsenic dopant and source region 14 is additionally doped with a phosphorous dopant. A polysilicon floating gate 12 is generally disposed above and between these regions and insulated from these regions by an insulating layer 16. Floating gate 12 at the completion of processing is completely surrounded by insulating layers and hence electrically floats. A second gate (i.e., a control gate) 11 is disposed above floating gate 12 that is fabricated from a second layer of polysilicon. A second insulating layer 17 separates floating gate 12 from control gate 11.

The memory cells of that prior flash EPROM are programmed by hot electron injection. Each of the memory cells is a MOS transistor having a floating gate. Energetic electrons are created in the silicon channel. The electrons are attracted and captured into the floating gate, thus altering the threshold voltage of that memory cell. The threshold voltage is the minimum amount of voltage that must be applied to the control gate before the memory cell is turned "on" to permit conduction between its source and drain region. The threshold voltage characteristic of the memory cell is controlled by the amount of charge that is retained on the floating gate of the memory cell. Such a cell is now said to be "programmed." The programming characteristics of a cell are exponential with respect to time.

Memory cell 10 is programmed (i.e., negatively charging the floating gate) by coupling control gate 11 to a gate programming potential of approximately +12 volts, drain region 13 to a drain programming potential of approximately +7 volts, and source region 14 to ground. Under these conditions, channel hot electron injection occurs through oxide layer 16. The electrons deposited on floating gate 12 of memory cell 10 causes the threshold voltage of memory cell 10 to rise. Memory cell 10 is now programmed to have a programmed threshold voltage $V_{TP}$.

To erase cell 10, drain region 13 is floated, control gate 11 is grounded and an erasure potential of approximately +12 volts is applied to source region 14. Under these conditions, charge is tunneled from floating gate 12 to source region 14. This removes the electrons deposited on floating gate 12 of memory cell 10, causing the threshold voltage of memory cell 10 to decrease. Memory cell 10 is now erased to have an erased threshold voltage $V_{TE}$.

To read cell 10, a positive read potential less than that which would cause charge to transfer onto floating gate 12 is applied to control gate 11 (e.g., 5 volts) and a potential (e.g., 1 volt) is applied to drain region 13. Current through the device is sensed to determine if floating gate 12 is or is not negatively charged.

The speed at which memory cell 10 is programmed largely depends on the programming ability of cell 10 and the programming voltages applied to cell 10. The programming ability of cell 10 affects the programmed threshold voltage $V_{TP}$ of the cell. One of the factors that affects the programming ability of cell 10 is the effective channel length $L_{eff}$ of the cell. Another factor is the peripheral circuitry that performs the programming operation to cell 10. For purposes of simplicity, the effective channel length $L_{eff}$ of the cell can be considered as quantifying the process variations and other variations. For example, lithographic, etching, and diffusion processes all contribute to the process variations. FIG. 2A illustrates the relationship of the threshold voltage $V_t$ of memory cell 10 during programming with respect to the programming time and the effective channel length $L_{eff}$.

In FIG. 2A, curve 21 is an example of the relationship between the threshold voltage and the programming time of cell 10 when the effective channel length $L_{eff}$ of cell 10 is 0.3 μm. Curve 22 indicates the relationship between the threshold voltage and programming time of cell 10 when the effective channel length $L_{eff}$ of cell 10 is 0.4 μm. As can be seen from FIG. 2A, if the effective channel length $L_{eff}$ is relatively longer, the programming time for cell 10 to reach the same threshold voltage will accordingly be longer when the programming voltages applied to cell 10 remain unchanged.

One disadvantage of a prior flash EPROM is that there are variations in effective channel length from cell to cell and variations in mean effective channel length for the flash EPROM from die-to-die and from fabrication lot to fabrication lot. In other words, a flash EPROM produced in one fabrication lot would, for example, typically have a different mean effective channel length from a flash EPROM produced in a different fabrication lot. This is so even though both flash EPROMs are of the same type. As noted above, these variations in effective channel length and mean effective channel length are due to process variations and other variations. The difference in the mean effective channel lengths of flash EPROMs typically causes the programming time to vary from flash EPROM to flash EPROM when the prior flash EPROMs with different effective channel lengths are programmed using the same programming voltages. The programming time of a floating gate flash EPROM cell varies inversely with respect to the drain programming voltage applied to the drain region of the cell during programming. FIG. 2B illustrates the relationship of the threshold voltage $V_t$ of memory cell 10 during programming with respect to the programming time and the programming drain voltage $V_D$ applied to memory cell 10. Memory cell 10 has a given programming ability in FIG. 2B.

In FIG. 2B, curve 23 is an illustration of the relationship between the threshold voltage and the programming time of cell 10 when the programming drain voltage $V_D$ is approximately 6 volts. Curve 24 illustrates the relationship between the threshold voltage and the programming time of cell 10 when the programming drain voltage $V_D$ is approximately 5 volts. As can be seen from FIG. 2B, if the programming drain voltage $V_D$ is relatively higher, the programming time for cell 10 to reach the same threshold voltage will accordingly be shorter when the programming ability of memory cell 10 remains the same.

FIG. 3 shows the circuitry of a prior drain programming voltage generation circuit 30 for generating a drain programming voltage for programming memory cells of a prior flash EPROM. Once drain programming voltage generation circuit 30 is fabricated, the drain programming voltage generated by circuit 30 cannot be adjusted to compensate for any variation in the effective channel length $L_{eff}$ of the prior flash EPROM.

Prior flash EPROMs typically include content addressable memory ("CAM") cells. The CAM cells are typically used to perform certain configuration and management functions. The CAM cells can be programmed to configure the flash EPROMs with respect to device operations. The CAM cells can also be used to activate (or deactivate) redundancy cells and reference cells with respect to the main memory array. The CAM cells are typically programmed with the configuration information before the flash EPROM reaches the end user as a final product.

SUMMARY AND OBJECTS OF THE INVENTION

One of the objects of the present invention is to provide circuitry and a method for selecting a drain programming voltage for a nonvolatile memory in order to compensate for differences in programming ability.

Another object of the present invention is to provide circuitry and a method for measuring the programming ability of a nonvolatile memory after fabrication and then setting the drain programming voltage for the nonvolatile memory in accordance with the measured programming ability such that the nonvolatile memory can be programmed to a predetermined programmed threshold voltage within a predetermined programming time.

Another object of the present invention is to provide circuitry and a method for minimizing the variations in programming times and programmed threshold voltages among nonvolatile-memories.

Another object of the present invention is to help ensure better uniformity of programming times and programmed threshold voltages among nonvolatile memories by individually selecting a drain programming voltage for each nonvolatile memory.

A further object of the present invention is to obtain a relatively tight distribution of programmed threshold voltages and programming times.

Another object of the present invention is maintain a relatively tight distribution of flash EPROM programming times from die-to-die and from fabrication lot to fabrication lot.

A method for using a drain programming voltage to minimize variations in programming ability of a nonvolatile memory is described. The programming ability of the nonvolatile memory is first determined after the nonvolatile memory is fabricated. The drain programming voltage is then set in accordance with the programming ability of the nonvolatile memory measured such that the nonvolatile memory can be programmed to have a predetermined programmed threshold voltage with a predetermined gate programming voltage for a predetermined programming time.

A nonvolatile memory residing on a single substrate is described. The nonvolatile memory includes a memory array having at least one memory cell. The memory cell includes a drain region, a source region, a control gate, and a floating gate. A drain programming voltage generation circuit is coupled to a programming voltage source and the drain region of the memory cell for providing a drain programming voltage to the drain region of the memory cell during programming of the memory cell. A control circuit is coupled to the drain programming voltage generation circuit for causing the drain programming voltage to vary with respect to the programming ability of the memory cell such that the memory cell is programmed to be within a predetermined range of a predetermined threshold voltage with a predetermined gate programming voltage for a predetermined programming time.

A method for setting a drain programming voltage of a nonvolatile memory is also described. A first value corresponding to a first voltage level of the drain programming voltage is set. The first value is then sent to a drain programming voltage generation circuit of the nonvolatile memory such that the drain programming voltage generation circuit generates the drain programming voltage in accordance with the first value. A plurality of unprogrammed memory cells of the nonvolatile memory are then selected for programming by applying the drain programming voltage to the selected plurality of unprogrammed memory cells for a predetermined programming time. The threshold voltage of one of the selected memory cells is measured after programming. The threshold voltage measured is then compared with a predetermined programmed threshold voltage for the nonvolatile memory. If the voltage level of the threshold voltage measured is not within a predetermined range of the predetermined programmed threshold voltage, then the drain programming voltage is changed. The process is then repeated. If the voltage level of the threshold voltage measured substantially matches that of the predetermined programmed threshold voltage, then the first value is stored in the nonvolatile memory to constantly control the drain programming voltage generation circuit to generate the drain programming voltage in accordance with the first value such that the nonvolatile memory is programmed to the predetermined programmed threshold voltage within the predetermined programming time.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
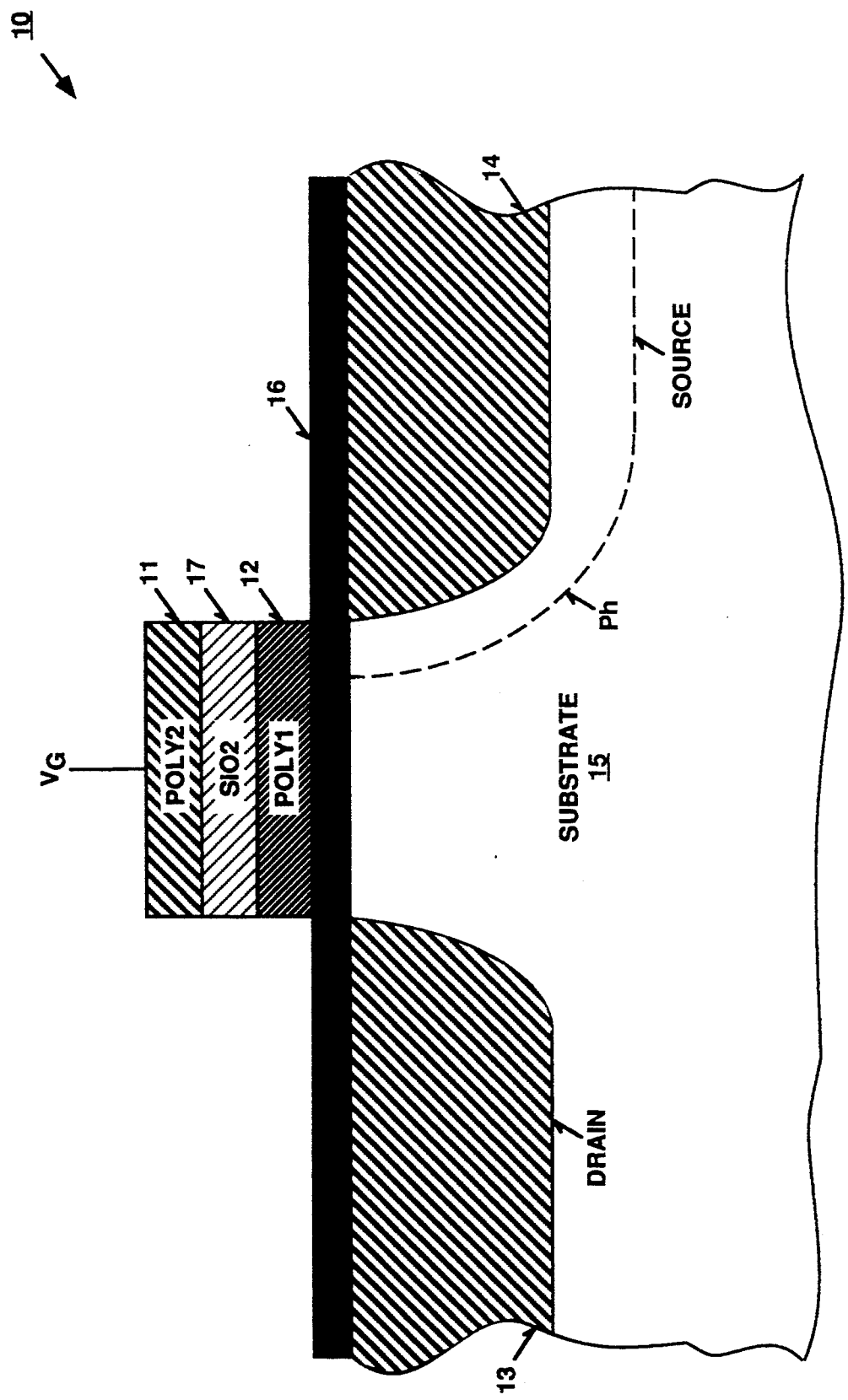
FIG. 1 is a schematic diagram of a floating gate memory cell of a flash EPROM.
Figure 2A:
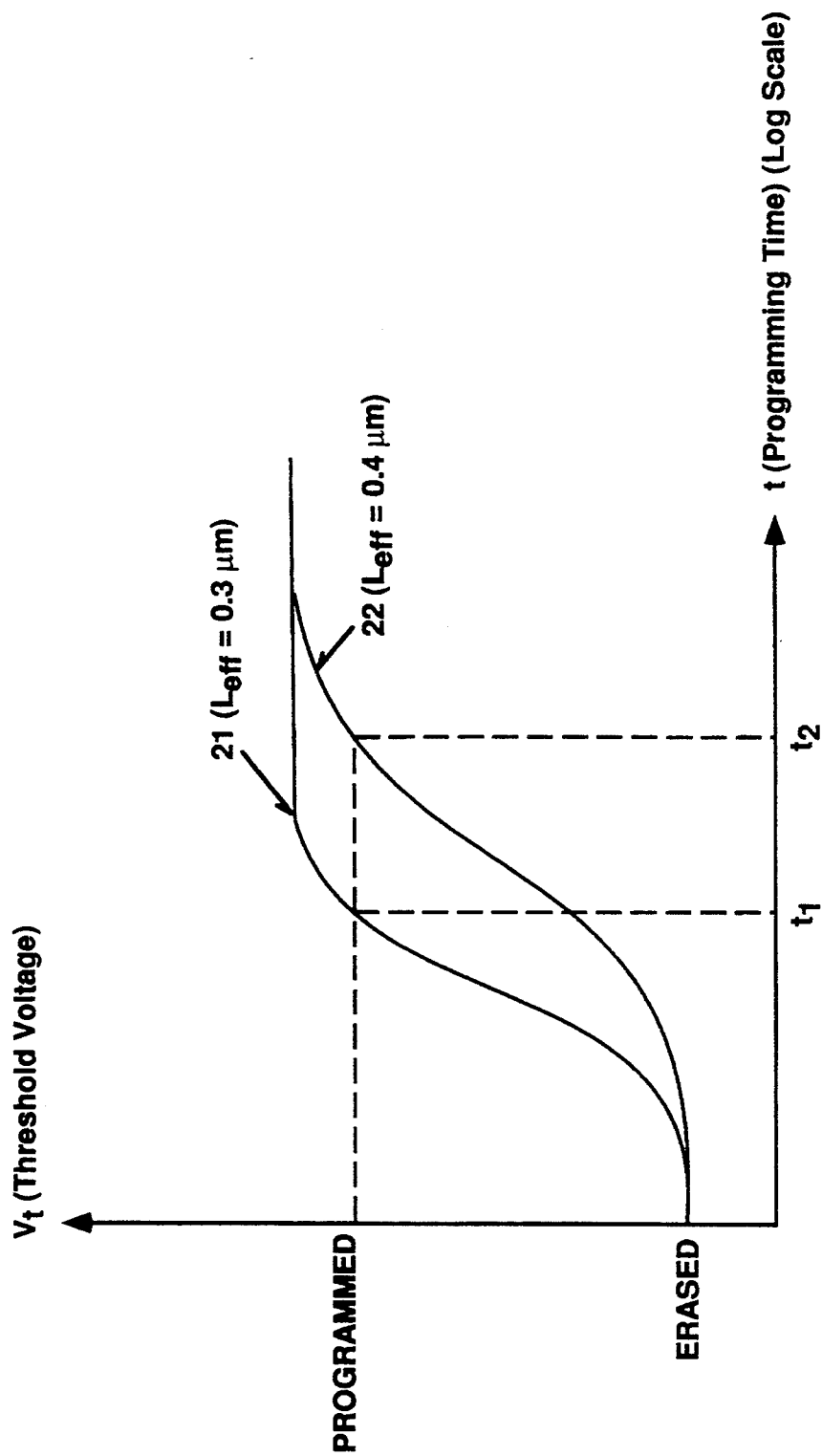
FIG. 2A is a voltage-time diagram illustrating the threshold voltage of the memory cell of FIG. 1 with respect to the programming time and the effective channel length of the memory cell.
Figure 2B:
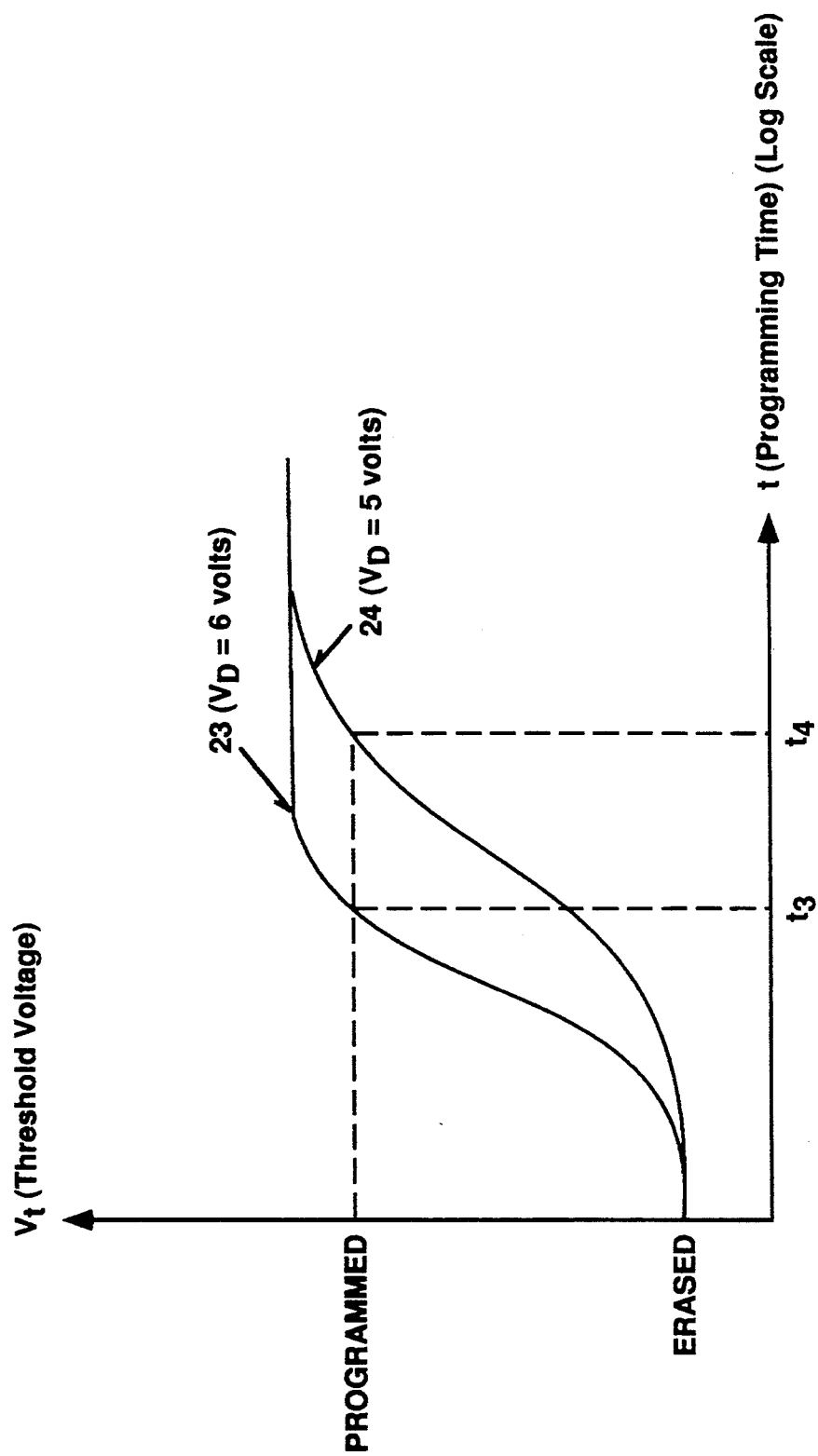
FIG. 2B is another voltage-time diagram illustrating the threshold voltage of the memory cell of FIG. 1 with respect to the programming time and the programming drain voltage applied to the memory cell during programming.
Figure 3:
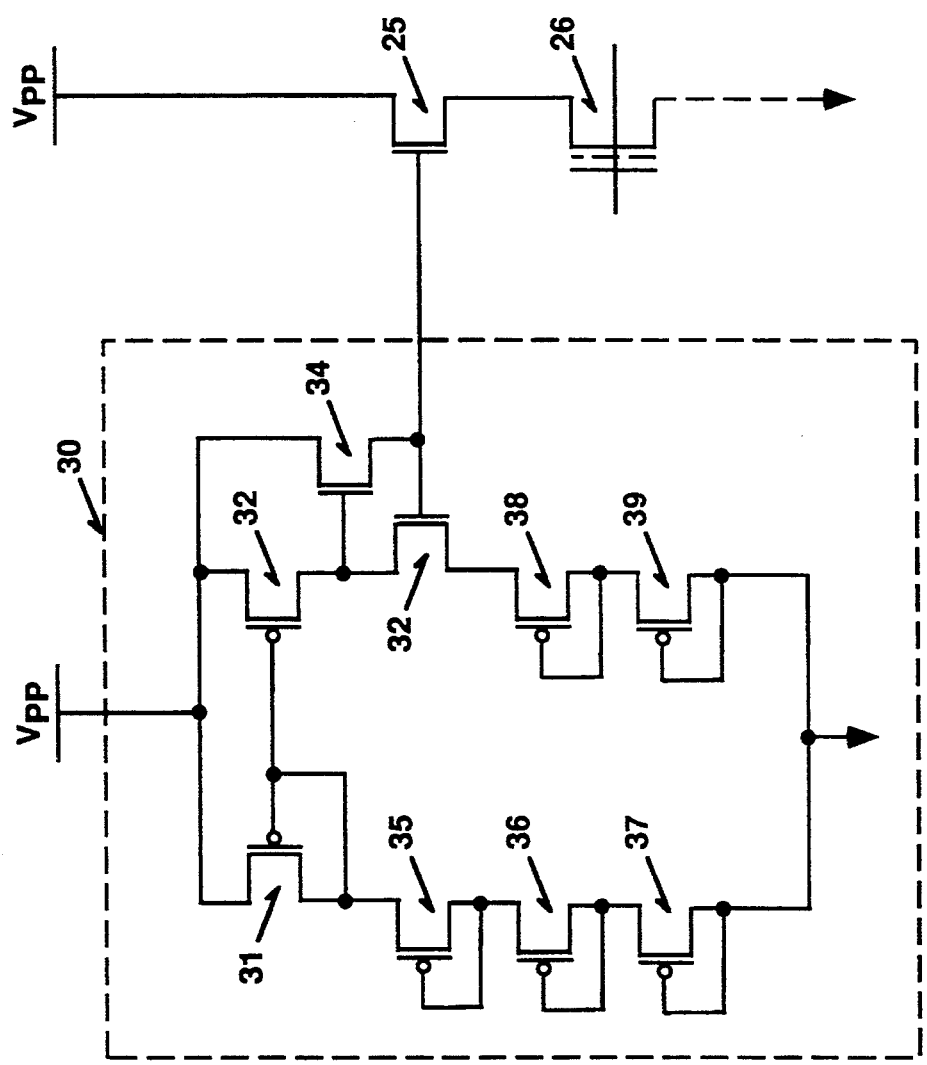
FIG. 3 is a circuit diagram of a prior drain programming voltage generation circuit for a flash EPROM.
Figure 4:
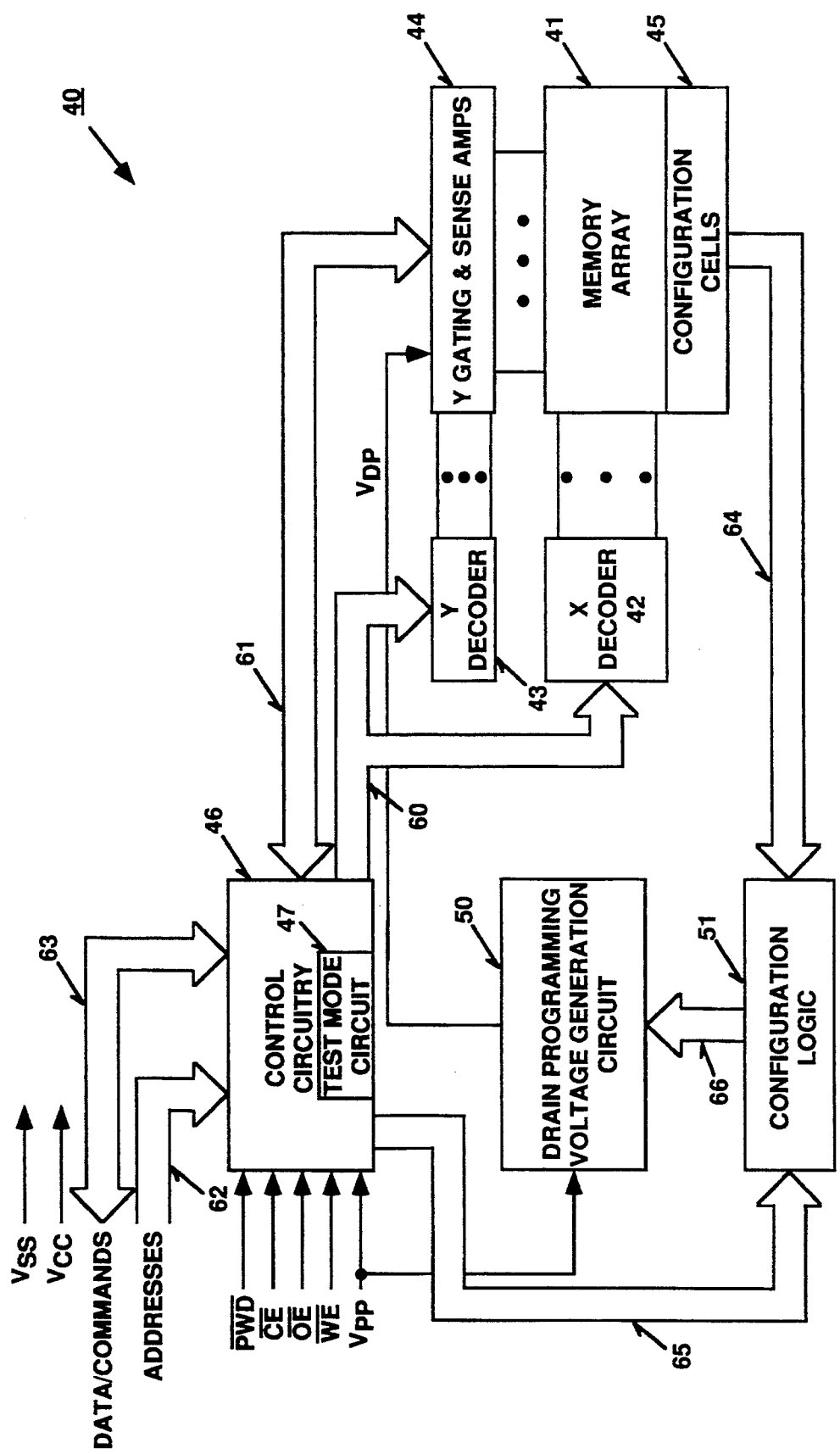
FIG. 4 is a block diagram of a flash EPROM that includes a drain programming voltage generation circuit, configuration logic, and configuration cells.

FIG. 4 is a block diagram of flash EPROM 40 that includes drain programming voltage generation circuit 50 and configuration logic 51. Flash EPROM 40 includes a memory array 41, which is made up of floating gate flash EPROM cells that store data at addresses. For one embodiment, memory array 41 stores 8 megabits of data. For another embodiment, memory array 41 stores 16 megabits of data. For alternative embodiments, memory array 41 can be smaller or larger. Flash EPROM 40 can be used in various types of computer systems.

As will be described in more detail below, the drain programming voltage for programming memory cells of flash EPROM 40 is selected after fabrication to help to avoid large variations in programming times and programmed threshold voltages between flash EPROM 40 and other flash EPROMs.

The programming ability of flash EPROM 40 is first measured after flash EPROM 40 is fabricated. The drain programming voltage is then set in accordance with the programming ability of flash EPROM 40 measured such that flash EPROM 40 is programmed to have a predetermined programmed threshold voltage with a predetermined gate programming voltage for a predetermined programming time.

For one embodiment, each of the memory cells in memory array 41 stores a single bit of data at one time. For another embodiment, each of the memory cells in the memory array 41 stores multiple bits of data at one time. For one embodiment, all the circuitry of flash EPROM 40 shown in FIG. 4 resides on a single substrate and employs CMOS circuitry.

Flash EPROM 40 includes an X decoder 42 and a Y decoder 43 coupled to memory array 41. X decoder 42 is the row decoder for memory array 41 and Y decoder 43 is the column decoder for memory array 41.

Flash EPROM 40 also includes an on-chip control circuitry 46 that controls the memory operations of flash EPROM 40. Control circuitry 46 includes an address latch for latching the addresses applied from external circuitry (not shown) to X and Y decoders 42 and 43 via bus 60. Control circuitry 46 also includes data buffers coupled to memory array 41 via bus 61 and Y gating 44 for buffering the data read from memory array 41 or the data to be programmed into memory array 41 at addresses. Moreover, control circuitry 46 also includes write state circuitry and command state circuitry. The write state circuitry steps flash EPROM 40 through multi-step sequences to program or erase memory array 41 with only an initiating command from the external circuitry. The command state circuitry decodes each command received and generates the appropriate control signals to the write state circuitry.

Control circuitry 46 is coupled to receive external addresses via address bus 62 and data and commands via data bus 63. Control circuitry 46 also applies data to the external circuitry via data bus 63. Control circuitry 46 receives a chip enable $\overline{CE}$ signal, an output enable $\overline{OE}$ signal, and a write enable $\overline{WE}$ signal. The chip enable signal $\overline{CE}$ is used for device selection of flash EPROM 40. The output enable signal $\overline{OE}$ is the output control for flash EPROM 40, dependent on device selection. The write enable signal $\overline{WE}$ allows writes to control circuitry 46 while the chip enable signal $\overline{CE}$ is active low.

Control circuitry 46 is also coupled to a $\overline{PWD}$ pin. The $\overline{PWD}$ pin supplies a power down control signal to control circuitry 46. The power down control signal $\overline{PWD}$ is an active low signal that causes flash EPROM 40 to enter the power down mode. Flash EPROM 40 returns to normal operation modes when the active $\overline{PWD}$ signal is deasserted.

Figure 5:
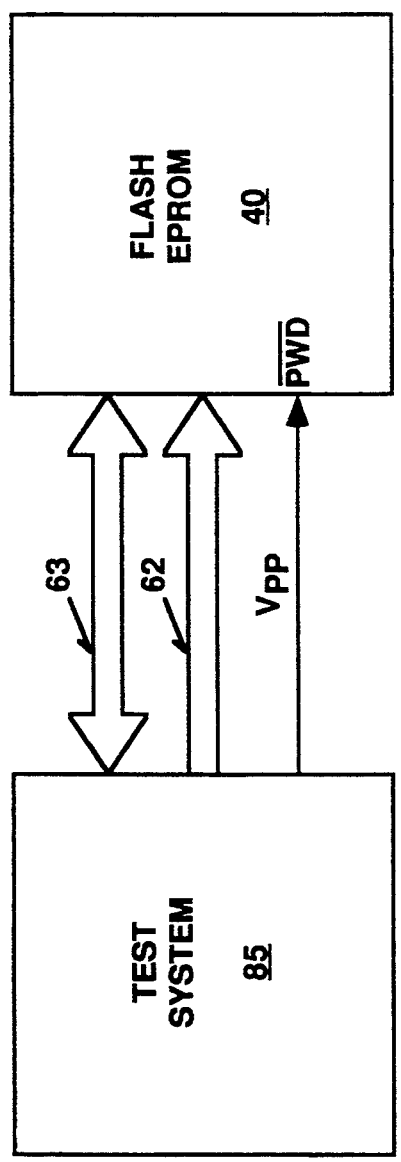
FIG. 5 is a block diagram of the flash EPROM of FIG. 4 connected to a test system.

Control circuitry 46 also includes a test mode circuit 47. Test mode circuit 47 causes flash EPROM 40 to enter the test mode when a high voltage of approximately 12 volts is applied to the $\overline{PWD}$ pin of flash EPROM 40. In the test mode, a series of tests can be conducted to determine whether flash EPROM 40 meets its device specifications. As shown in FIG. 5, an external test system 85 is used to control the tests on flash EPROM 40. In addition, test system 85 also controls control circuitry 46 to configure flash EPROM 40 during and after the tests.

Flash EPROM 40 also includes a drain programming voltage generation circuit 50 and a configuration logic 51. Drain programming voltage generation circuit 50 generates a drain programming voltage $V_{DP}$ that is applied to the drain of selected memory cells of memory array 41 during programming. After flash EPROM 40 is fabricated but before it reaches the end user, configuration logic 51 is used to adjust the voltage level of the drain programming voltage $V_{DP}$ generated by circuit 50.

Process variations and other variations from flash EPROM to flash EPROM lead to differences in programming abilities among flash EPROMs. Different voltage levels of drain programming voltage $V_{DP}$ can have the effect of (1) slowing down the otherwise fast programming cells or (2) speeding up the otherwise slow programming cells. By selecting a target programming time and a target programmed threshold voltage, and then using voltage generation circuit 50 and configuration logic 51 to generate and select an appropriate drain programming voltage $V_{DP}$ for flash EPROM 40, the actual programming time and programmed threshold voltage of flash EPROM 40 can be made to be close to the target programming time and the target programmed threshold voltage. This helps to ensure that the deviation of the target programming ability of flash EPROM 40 is compensated for. This method, when applied to a production run of flash EPROMs, helps to minimize the differences in programming ability among the flash EPROMs. In other words, the programming times and the programmed threshold voltages of the flash EPROMs are more uniform and are closer to the target programming time and the target programmed threshold voltage.

Flash EPROM 40 also includes configuration cells 45. Configuration cells 45 are located peripheral to memory array 41. Configuration logic 51 and voltage generation circuit 50 in conjunction with configuration cells 45 cause a drain programming voltage $V_{DP}$ to be selected for flash EPROM 40. Each of configuration cells 45 is a CAM cell.

Flash EPROM 40 also includes other configuration cells (not shown) in addition to configuration cells 45.

$V_{PP}$ is the program/erase power supply voltage for flash EPROM 40. $V_{PP}$ is also coupled to drain programming voltage generation circuit 50. $V_{CC}$ is the device power supply for flash EPROM 40 and $V_{SS}$ is ground. For one embodiment, $V_{PP}$ is approximately 12.0 volts and $V_{CC}$ is approximately 5.0 volts. The memory operations of flash EPROM 40 include read, programming, and erasure.

After flash EPROM 40 is fabricated but before it reaches the end user, flash EPROM 40 is connected to test system 85 for determining the appropriate drain programming voltage $V_{DP}$ as shown in FIG. 5. Test system 85 is a computer controlled test system. Test system 85 causes flash EPROM 40 to enter the test mode. Test system 85 sends the appropriate commands, addresses, and data to flash EPROM 40 via buses 62–63 to determine the appropriate drain programming voltage $V_{DP}$ for flash EPROM 40. The process of determining and setting the appropriate drain programming voltage $V_{DP}$ is implemented by a software program that is executed in test system 85.

Figure 6A:
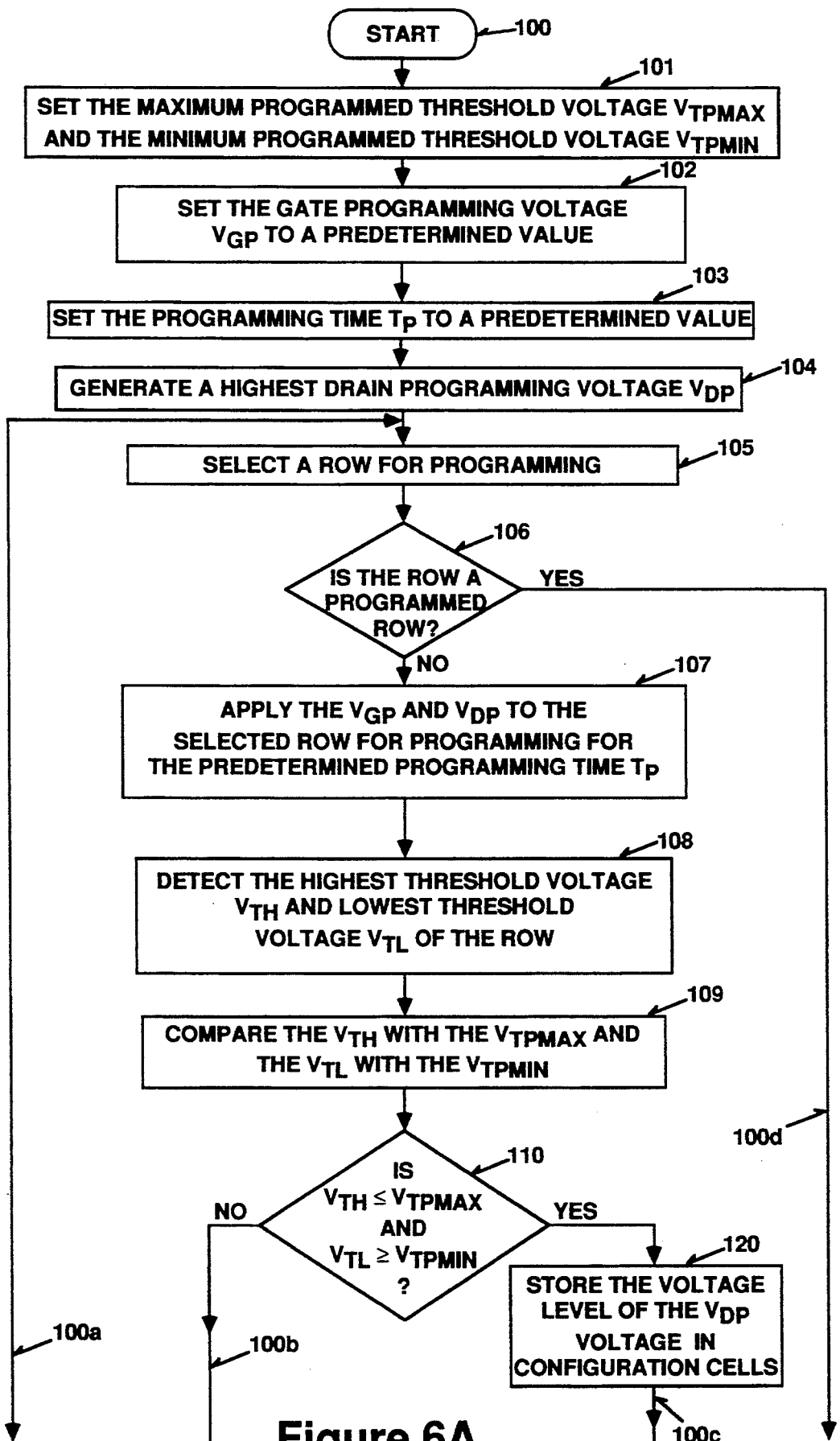
FIGS. 6A and 6B are flow chart diagrams that show the process of setting the voltage level of the drain programming voltage.
Figure 6B:
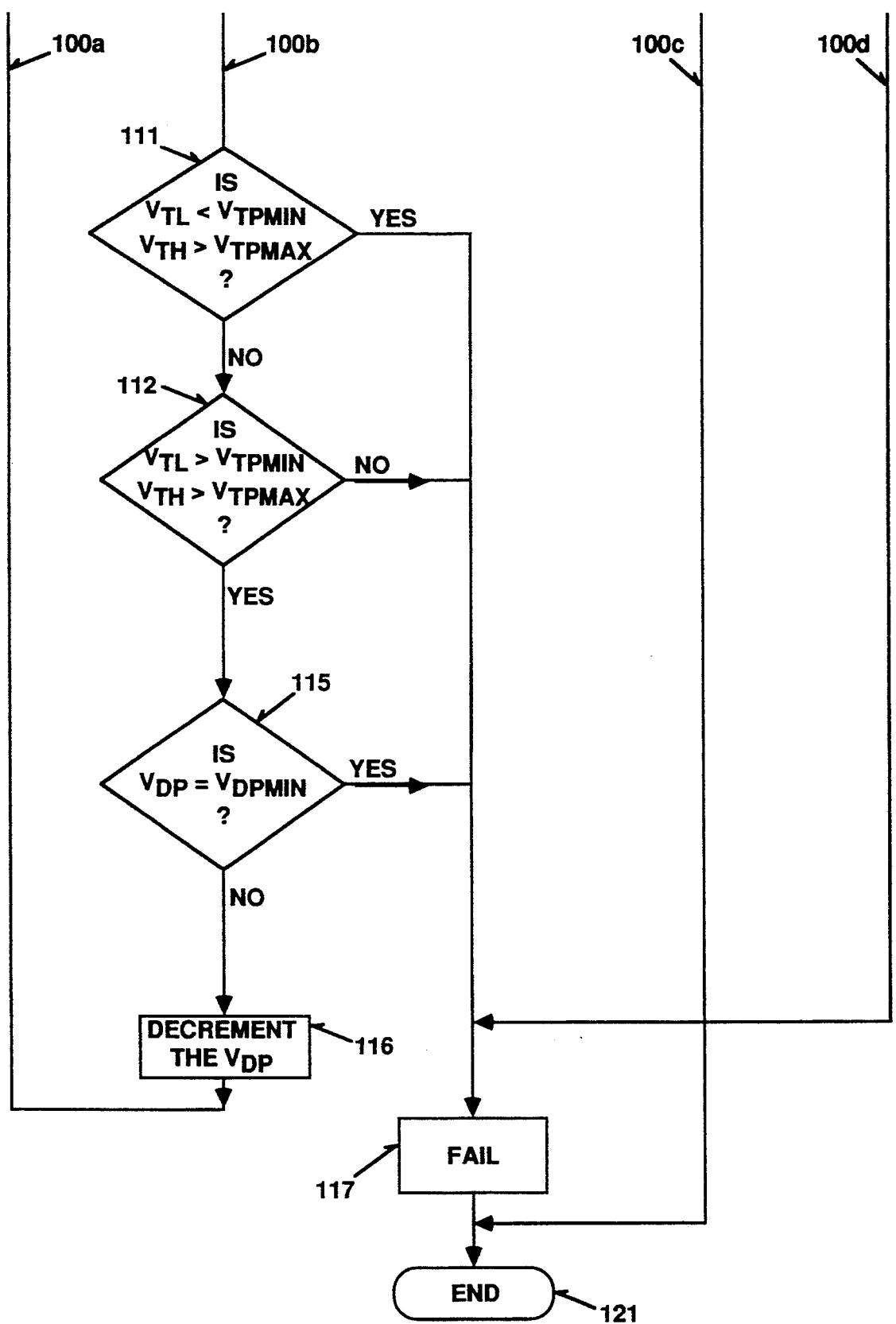

As shown in FIGS. 6A and 6B, after test system 85 causes flash EPROM 40 to enter the test mode, the process begins at step 101 at which test system 85 sets the maximum programmed threshold voltage $V_{TPMAX}$ and the minimum programmed threshold voltage $V_{TPMIN}$ for flash EPROM 40. The $V_{TPMAX}$ voltage represents the highest programmed threshold voltage that is allowed for flash EPROM 40. The $V_{TPMIN}$ voltage represents the lowest programmed threshold voltage that is allowed for flash EPROM 40. By setting the $V_{TPMAX}$ and $V_{TPMIN}$ voltages, a voltage window is provided that allows the actual programmed threshold voltage $V_T$ of flash EPROM 40 to vary within the voltage window. For one embodiment, the $V_{TPMAX}$ voltage is set at 6.8 volts and the $V_{TPMIN}$ voltage is set at 6.0 volts.

The programmed threshold voltage $V_T$ should be at least approximately 5.0 volts. To safeguard flash EPROM 40 from aging, the initial programmed threshold voltage should be set higher than 5.0 volts. Aging means that the programmed threshold voltage $V_T$ may drop during the lifetime of flash EPROM 40.

The voltage window defined by the $V_{TPMAX}$ and $V_{TPMIN}$ voltage is provided in order to allow the actual programmed threshold voltage of the memory cells of flash EPROM 40 to vary within that range. This is because the programming ability may vary slightly from one memory cell to another memory cell within the single flash EPROM 40.

The voltage level of the $V_{TPMAX}$ voltage is selected such that it will not cause overstress to the memory cells being programmed. The voltage level of the $V_{TPMIN}$ voltage is selected such that it will not cause the programmed memory cells to be mistaken as erased cells.

Test system 85 then sets the gate programming voltage $V_{GP}$ to a predetermined value at step 102. For one embodiment, the gate programming voltage $V_{GP}$ is set at approximately 12 volts. Test system 85 then sets the programming time $T_P$ for flash EPROM 40 to a predetermined value at step 103.

For one embodiment, the programming time $T_P$ is set within a range from two microseconds to three microseconds. For an alternative embodiment, the programming time $T_P$ can be set within a range from four microseconds to six microseconds.

Test system 85 causes drain programming voltage generation circuit 50 to generate the drain programming voltage $V_{DP}$ via configuration logic 51 at step 104. Test system 85 controls configuration logic 51 to set the voltage level of the $V_{DP}$ voltage generated by the drain programming voltage generation circuit 50. Test system 85 accesses configuration logic 51 via control circuit 46 and bus 65 to control the setting the voltage level of the $V_{DP}$ voltage. The $V_{DP}$ voltage can be set at different voltage levels. The voltage levels of the $V_{DP}$ voltage can be set evenly apart or unevenly apart.

For one embodiment, the $V_{DP}$ voltage is set at four different voltage levels. For this embodiment, the lowest voltage level of the $V_{DP}$ voltage is set at 5.1 volts. The second voltage level of the $V_{DP}$ voltage is set at 5.6 volts. The difference in voltage levels is 0.5 volts. The third voltage level of the $V_{DP}$ voltage is set at 5.8 volts. The difference in voltage levels is 0.2 volts. The fourth voltage level of the $V_{DP}$ voltage is set at 6.2 volts. The difference in voltage levels is 0.4 volts. The uneven steps in voltage levels provide a quick ramp-up to the most likely voltage levels, with a fine resolution for the programming time $T_P$. For an alternative embodiment, the four voltage levels of the $V_{DP}$ voltage can be set in even steps from 5.1 volts to 6.2 volts.

For another embodiment, the $V_{DP}$ voltage can be set at eight different voltage levels. For a further embodiment, the $V_{DP}$ voltage can be set at sixteen different voltage levels. For still a further embodiment, the different voltage levels of the $V_{DP}$ voltage are set from 5.2 volts to 6.6 volts. The more voltage levels the $V_{DP}$ voltage has, the finer resolution the programming time $T_P$ can be.

Initially, test system 85 causes configuration logic 51 to start at the highest voltage level of the $V_{DP}$ voltage at step 104. At this step, test system 85 sends a control value associated with the highest voltage value of the $V_{DP}$ voltage to configuration logic 51 via control circuitry 46 and bus 65. Configuration logic 51 then controls drain programming voltage generation circuit 50 to generate the $V_{DP}$ voltage in accordance with the control value in configuration logic 51. For another embodiment, test system 85 causes configuration logic 51 to start at the lowest voltage level of the $V_{DP}$ voltage at step 104.

At step 105, test system 85 selects a row of memory cells in memory array 41 of flash EPROM 40 for programming. Test system 85 selects the row. For one embodiment, a memory row in memory array 41 of flash EPROM 40 includes 8192 ("8K") memory cells.

Test system 85 selects the memory rows for setting the drain programming voltage $V_{DP}$ during a device characterization process of flash EPROM 40. In other words, the selected rows in this process are preselected rows. These preselected rows selected in the device characterization process represent the array distribution of memory array 41.

At step 106, test system 85 determines if the selected row of memory array 41 is an unprogrammed row. If the selected row is not an unprogrammed row, then test system 85 goes to step 117, at which flash EPROM 40 is failed.

For an alternative embodiment, the selected row can be a slightly programmed row.

If, at step 106, the selected row is an unprogrammed memory row, then the process moves to step 107, at which test system 85 causes control circuitry 46 to program the selected memory row. Test system 85 causes the predetermined gate programming voltage $V_{GP}$ to be applied to the gate of the selected row. Test system 85 controls control circuitry 46 to apply the $V_{GP}$ to the gate of the selected row. Test system 85 also causes the $V_{DP}$ voltage generated by drain programming voltage generation circuit 50 to be applied to the drain of the memory cells of the selected row. As described above, the voltage level of the drain programming voltage $V_{DP}$ is set by test system 85 via configuration logic 51. Test system 85 then triggers control circuitry 46 of flash EPROM 40 to control the programming operation of the selected row for the predetermined time $T_P$. Test system 85 causes control circuitry 46 to control the programming of the selected row for the predetermined programming time $T_P$. Control circuitry 46 does this by changing the pulse width of the $V_{GP}$ and $V_{DP}$ voltages applied to the selected row. The programming operation then stops at the end of the predetermined programming time $T_P$. The predetermined programming time $T_P$ is stored in control circuitry 46.

At step 108, test system 85 detects through control circuitry 46 the programmed threshold voltage $V_T$ of each of the memory cells of the selected row. Test system 85 determines the highest threshold voltage $V_{TH}$ and the lowest threshold voltage $V_{TL}$ among the programmed memory cells of the selected row. At step 109, test system 85 compares the $V_{TH}$ voltage with the maximum programmed threshold voltage $V_{TPMAX}$. Test system 85 also compares the $V_{TL}$ voltage with the minimum programmed threshold voltage $V_{TPMIN}$.

At step 110, test system 85 determines if the $V_{TL}$ and $T_{TH}$ voltages are within the voltage window defined by the $V_{TPMAX}$ and $V_{TPMIN}$ voltages. If the $V_{TH}$ and $V_{TL}$ voltages are within the voltage window of the $V_{TPMAX}$ and $V_{TPMIN}$ voltages, then the process moves to step 120, at which the control value in configuration logic 51 (that determines the voltage level of the $V_{DP}$ voltage) is then stored in configuration cells 45. The process then ends at step 121.

As can be seen from FIG. 4, configuration cells 45 are coupled to configuration logic 51 via bus 64. Configuration cells 45 store the control value in a nonvolatile manner. Configuration cells 45 are transparent to the end user and can only be accessed by test system 85.

By storing the control value in configuration cells 45, drain programming voltage generation circuit 50 is constantly controlled to generate the $V_{DP}$ voltage at the voltage level determined by the control value after flash EPROM 40 exits the test mode. This ensures that the drain programming voltage $V_{DP}$ is properly tailored for the programming ability of the memory cells of flash EPROM 40.

If, at step 110, it is determined that the $V_{TH}$ and $V_{TL}$ voltages are not within the voltage window defined by the $V_{TPMAX}$ and $V_{TPMIN}$ voltages, then test system 85 moves to step 111 at which another judgment is made to determine if the $V_{TL}$ voltage is lower than the $V_{TPMIN}$ voltage and the $V_{TH}$ voltage is higher than the $V_{TPMAX}$ voltage. If so, flash EPROM 40 is labeled as a failure at step 117. If not, the process moves to step 112 at which test system 85 determines if the $V_{TL}$ voltage is higher than the $V_{TPMIN}$ voltage and the $V_{TH}$ voltage is higher than the $V_{TPMAX}$ voltage. If not, at step 117 flash EPROM 40 is marked as having failed.

If, at step 112, the $V_{TL}$ voltage and the $V_{TH}$ voltage are determined to be higher than the $V_{TPMIN}$ voltage and the $V_{TPMAX}$ voltage, respectively, the process moves to step 115, at which the $V_{DP}$ voltage is compared with the $V_{DPMIN}$ voltage. The $V_{DPMIN}$ voltage is the lowest voltage level set for the $V_{DP}$ voltage. If, at step 115, the $V_{DP}$ voltage is equal to the $V_{DPMIN}$ voltage, then at step 117 flash EPROM 40 is labeled as a failure. If not, the $V_{DP}$ voltage is decreased at step 116 to the next voltage level set for the $V_{DP}$ voltage and step 105 becomes the next step to repeat the process until the appropriate $V_{DP}$ voltage is found for flash EPROM 40.

Figure 7:
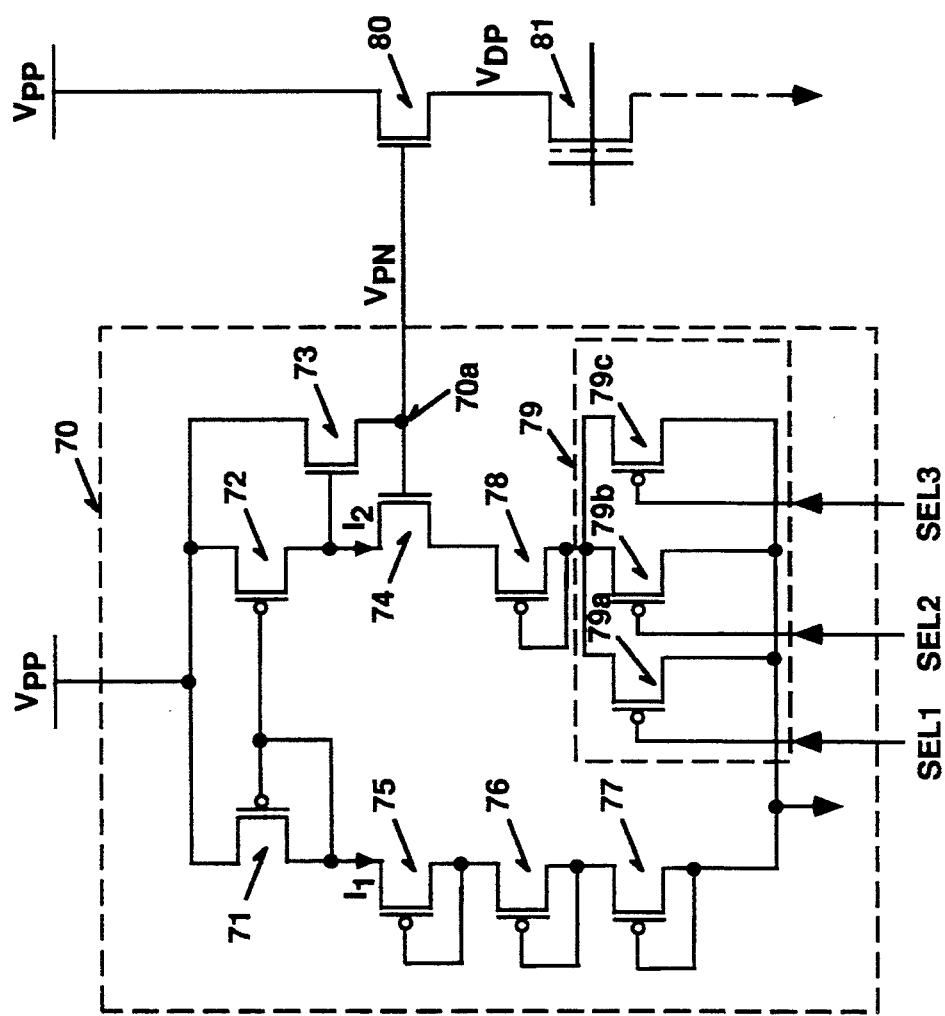
FIG. 7 is a circuit diagram of the drain programming voltage generation circuit of FIG. 4.

FIG. 7 illustrates the circuit of drain programming voltage generation circuit 70 that is one embodiment of drain programming voltage generation circuit 50 of FIG. 4. FIG. 7 also illustrates a flash EPROM cell 81 to which circuit 70 is coupled via a load transistor 80. Flash EPROM cell 81 is one of the memory cells of memory array 41 of FIG. 4. Load transistor 80 is also coupled to the programming voltage $V_{PP}$. Load transistor 80 is an N channel transistor. The gate of load transistor 80 is coupled to an output node 70a of drain programming voltage generation circuit 70 for receiving a gate voltage $V_{PN}$. The gate voltage $V_{PN}$ controls load transistor 80 to apply the drain programming voltage $V_{DP}$ to the drain region of cell 81 during programming. The voltage level of the $V_{DP}$ voltage is therefore equal to that of the $V_{PN}$ voltage minus the threshold voltage of load transistor 80. Therefore, the $V_{DP}$ voltage follows the $V_{PN}$ voltage.

Drain programming voltage generation circuit 70 includes (1) a current mirror circuit formed by P-channel transistors 71–72 and 75–77, (2) a source follower circuit formed by N-channel transistors 73 and 74, and (3) a voltage setting circuit formed by a P-channel transistor 78 and three P-channel transistors 79a through 79c connected in parallel. The source of each of transistors 79a–79c is coupled to the drain of transistor 78. The drain of each of transistors 79a–79c is coupled to ground. Each of transistors 79a–79c has its gate coupled to one of three selection signals SEL1 through SEL3. The selection signals SEL1–SEL3 turn on or turn off their respective transistors 79a–79c. The selection signals are applied from configuration logic 51 of FIG. 4.

The current mirror circuit formed by transistors 71–72 and 75–77 is coupled to the $V_{PP}$ voltage and ground for generating an $I_2$ current that is applied to the voltage setting circuit of transistors 78–79c via the source follower circuit of transistors 73–74. The current level of the $I_2$ current acts as a function of an $I_1$ current that flows through transistors 75–77. The current level of the $I_1$ current depends on the size of transistors 75–77.

As can be seen from FIG. 7, each of transistors 75–77 is connected to act as a resistor in the circuit. Therefore, when the $I_1$ current is accurately set, the $I_2$ current generated by the current mirror circuit is also accurately set. Transistors 75–77 are constantly turned on.

As described above, the $I_1$ current is dependent on the size of transistors 75–77. Therefore, by adjusting the size of transistors 75–77 during fabrication, the $I_1$ current can be changed. Therefore, transistors 75–77 act as a current setting circuit of the current mirror circuit.

As described above, the source follower circuit of circuit 70 includes N-channel transistors 73–74. Transistor 73 has its drain coupled to the $V_{PP}$ voltage, its source coupled to output node 70a, and its gate coupled to the drain of transistor 72 of the current mirror circuit. Transistor 74 has its drain coupled to the gate of transistor 73, its source coupled to the voltage setting circuit, and its gate coupled to output node 70a. The function of the source follower circuit comprised of transistors 73–74 is to provide a positive feedback loop for output node 70a which quickly charges and settles the voltage level of the $V_{PN}$ voltage at output node 70a to the voltage level set by the turned-on ones of transistors 78–79c plus the threshold voltage of transistor 74.

As can be seen from FIG. 7, transistors 79a–79c are selectively turned on by the SEL1–SEL3 signals in order to adjust the voltage level of the $V_{DP}$ voltage applied to flash EPROM cell 81. One of the advantages of the circuit is that it does not need to know the effective channel length of the memory cells of flash EPROM 40.

Figure 8:
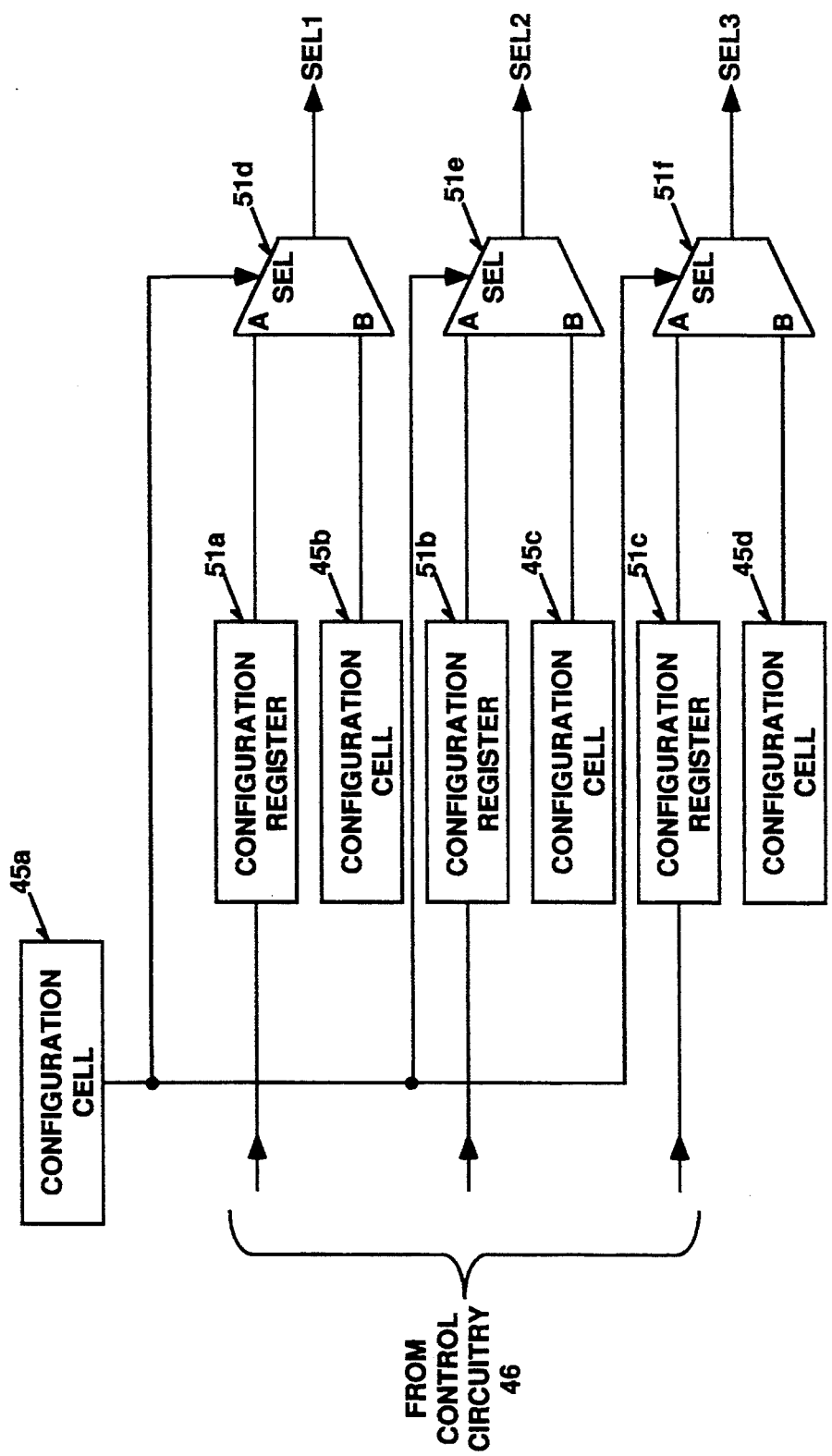
FIG. 8 is a block diagram of the configuration logic and the configuration cells of FIG. 4.

FIG. 8 is a block diagram of the combination of configuration cells 45 and configuration logic 51. In FIG. 8, configuration cells 45 include configuration cells 45a through 45d. Configuration logic 51 includes configuration registers 51a through 51c and multiplexers 51d through 51f. Configuration register 51a and configuration cell 45b are coupled to multiplexer 51d. Configuration register 51b and configuration cell 45c are coupled to multiplexer 51e and configuration register 51c and configuration cell 45d are coupled to multiplexer 51f. Multiplexers 51d–51f generate the SEL1–SEL3 selection signals sent to the gates of transistors 79a–79c of drain programming voltage generation circuit 70. Configuration cell 45a controls the selection of the SEL1–SEL3 signals from either configuration registers 51a–51c or configuration cells 45b–45d. After flash ERPOM 40 is fabricated, configuration cells 45a–45d are all in the erased state. This causes each of multiplexers 51d–51f to select the output of its respective one of configuration registers 51a–51c as its output signal. Configuration registers 51a–51c are accessed by test system 85 (FIG. 5) via control circuitry 46 during the test mode of flash EPROM 40 to adjust the voltage level of the $V_{DP}$ voltage. Test system 85 sends the control value that causes drain programming voltage generation circuit 50 to generate the $V_{DP}$ voltage in accordance with the control value. The control value is then applied to become the SEL1–SEL3 signals from configuration registers 51a–51c. If the appropriate $V_{DP}$ voltage is generated, the control value is then stored into configuration cells 45b–45d. Configuration cell 45a is then programmed to cause each of multiplexers 51d–51f to select the respective one of configuration cells 45b–45d as its output. If not, the control value is adjusted in registers 51a–51c by test system 85 (FIG. 5) that causes the $V_{DP}$ voltage to be generated again until the appropriate voltage level of the $V_{DP}$ voltage is determined. The control value is a 3-bit binary value.

Figure 9:
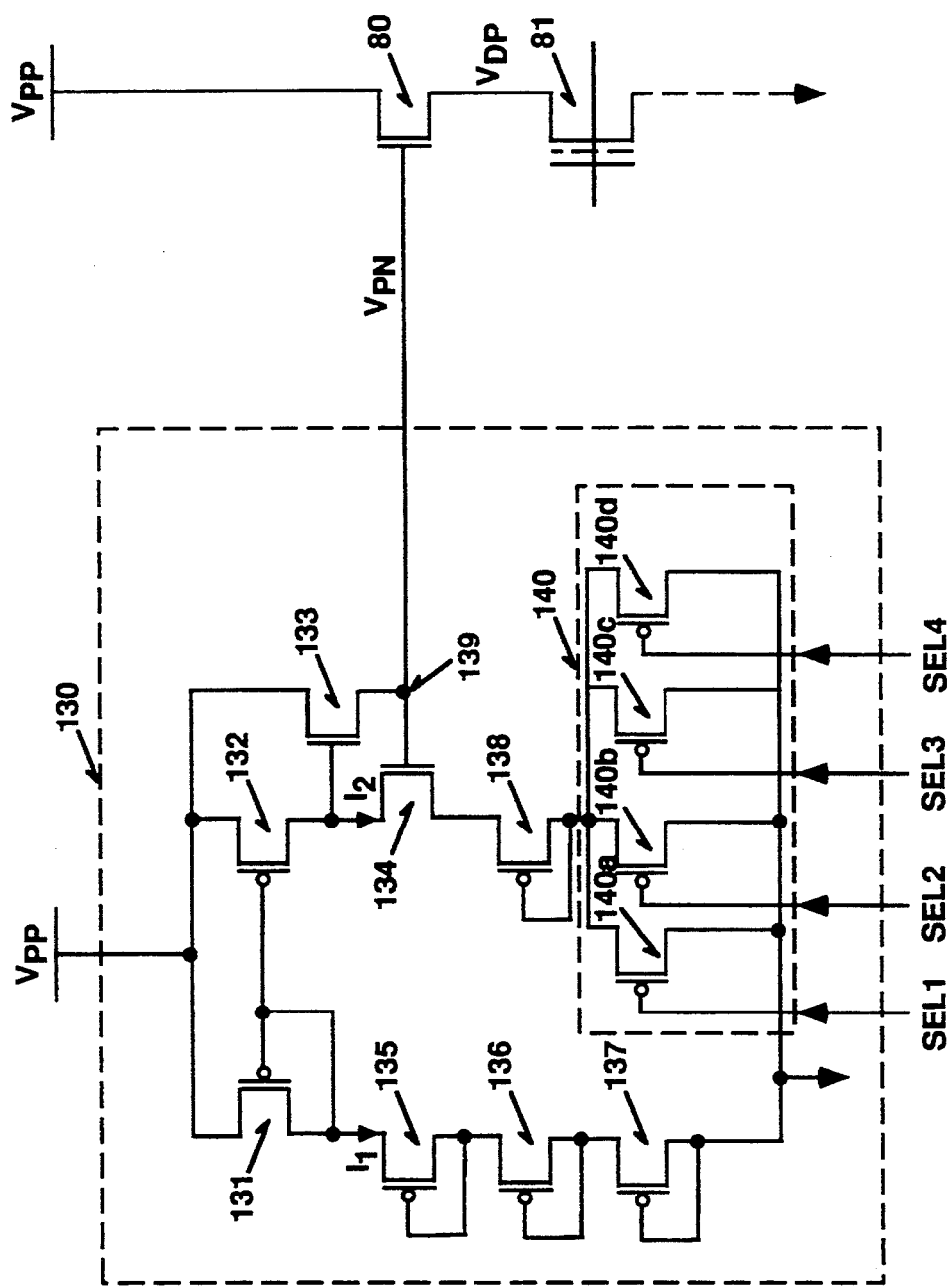
FIG. 9 is a circuit diagram that shows another embodiment of the drain programming voltage generation circuit of FIG. 4.

FIG. 9 illustrates drain programming voltage generation circuit 130, which is another embodiment of drain programming voltage generation circuit 50. As can be seen from FIGS. 7 and 9, circuit 130 is similar to that of circuit 70, except that four transistors 140a through 140d are connected in parallel in circuit 130. This permits drain programming voltage generation circuit 130 to generate additional voltage levels of $V_{DP}$.

Figure 10:
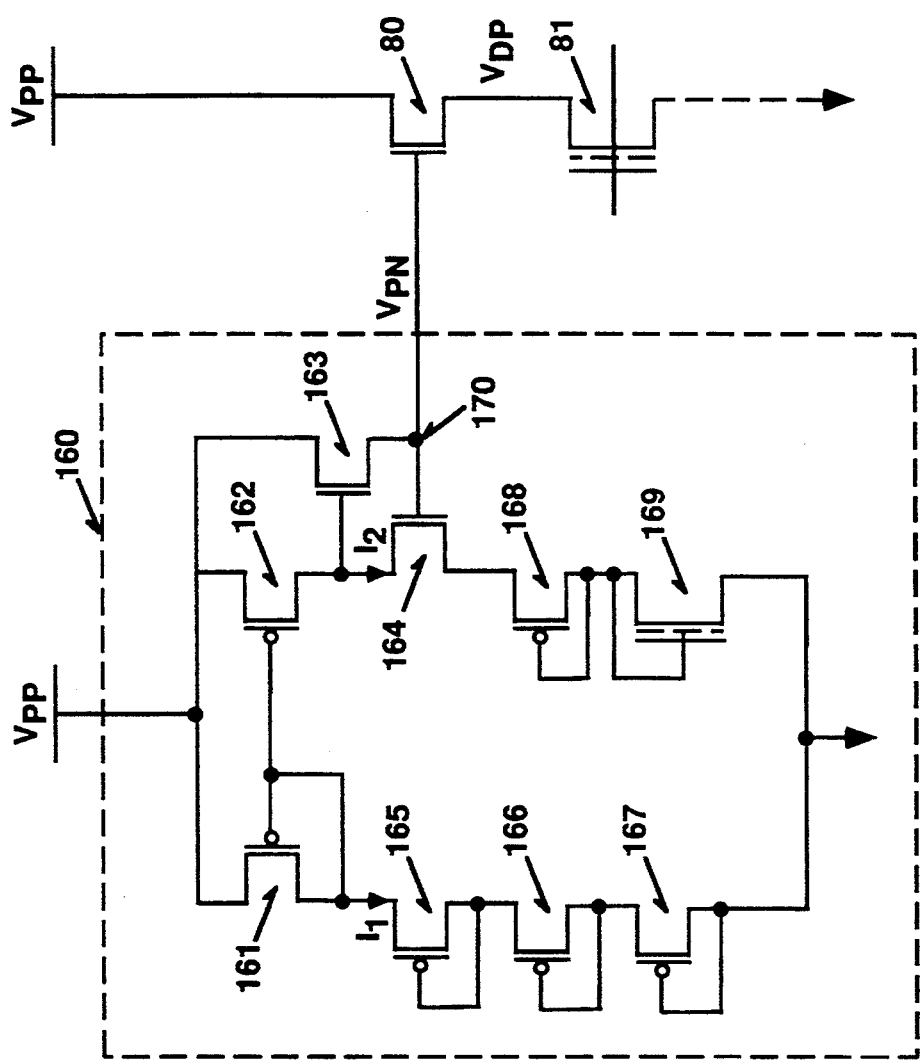
FIG. 10 is a circuit diagram that shows another embodiment of the drain programming voltage generation circuit of FIG. 4.

FIG. 10 illustrates drain programming voltage generation circuit 160, which is another embodiment of drain programming voltage generation circuit 50. Transistor 169 of circuit 160 of FIG. 10 is a flash EPROM transistor. In contrast, transistors 140a–140d of circuit 130 of FIG. 9 are P-channel transistors connected in parallel. Flash EPROM transistor 169 has its control gate connected to its floating gate. As can be seen from FIG. 10, transistor 169 is connected such that it is constantly on. Transistor 81 is a flash EPROM memory cell. When circuit 160 is used in place of drain programming voltage generation circuit 50 of flash EPROM 40 of FIG. 4, configuration logic 51 is not required. Instead, the $V_{DP}$ voltage generated by circuit 160 automatically tracks the effective channel length of a memory cell of the flash EPROM. The effective channel length of a memory cell can be considered as quantifying the process variation and other variations.

Given that transistors 169 and 81 are both flash EPROM transistors fabricated on the same substrate by the same process, any deviation in the effective channel length of transistor 81 (due to the process variations) from a target effective channel length for the flash EPROM will also be reflected by the deviation of the effective channel length of transistor 169. A deviation in effective channel length from a target effective channel length means that the programming time for a flash cell at a programmed threshold voltage level deviates from the target programming time. In other words, the programming ability of the cell is off target.

Because transistor 169 is a flash EPROM transistor, the level of the $V_{DP}$ voltage varies as a function of the effective channel length of transistor 169. The longer the effective channel length, the higher the drain voltage $V_{DP}$. The shorter the effective channel length, the lower the drain voltage $V_{DP}$. Thus, the drain voltage $V_{DP}$ is made to track effective channel length, which helps to ensure that the programming time (for a programmed threshold voltage) for memory cell 81 is close to or at the target programming time for the flash EPROM, even if there is a deviation of actual effective channel length from the target effective channel.

For one embodiment, the voltage $V_{DP}$ set by circuit 160 is used for all the memory cells of the flash EPROM. This yields satisfactory results if the effective channel length of cell 81 is close to the mean effective channel length of the memory cells of the flash EPROM.

Figure 11:
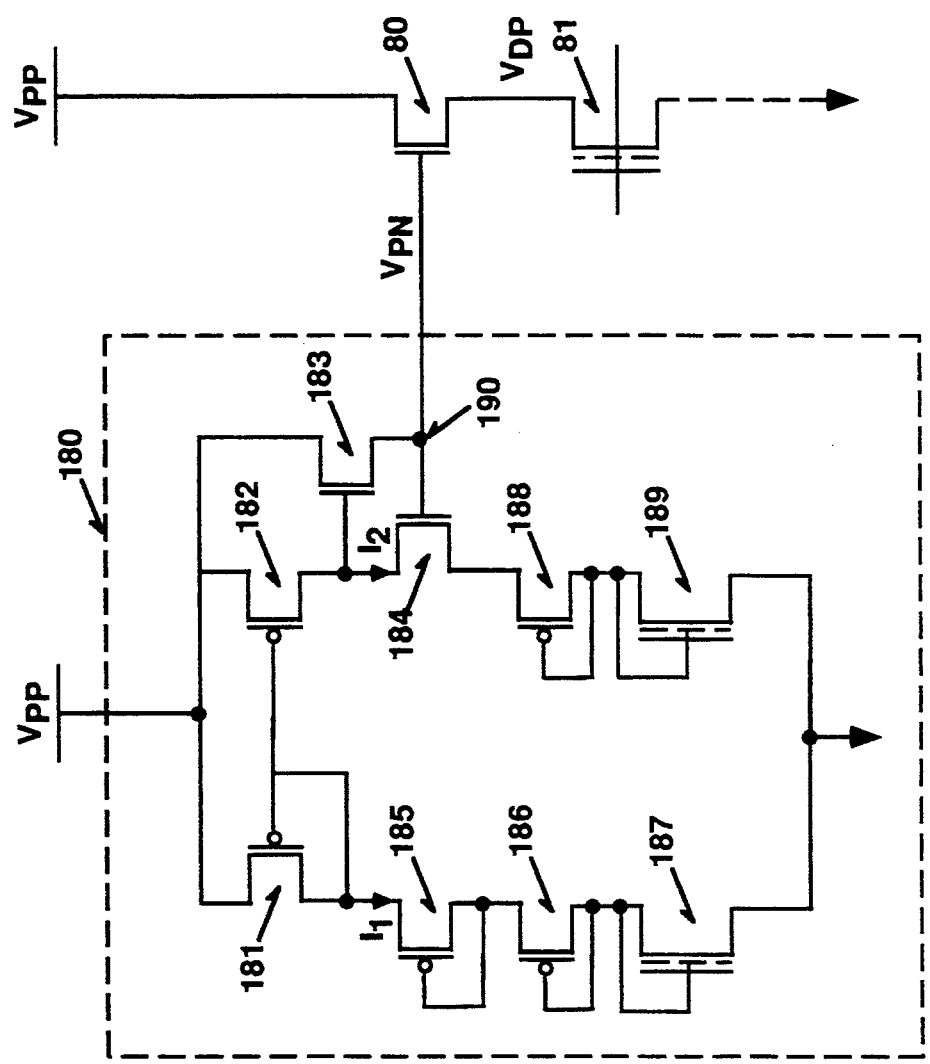
FIG. 11 is a circuit diagram that shows a further embodiment of the drain programming voltage generation circuit of FIG. 4.

FIG. 11 illustrates drain programming voltage generation circuit 180, which is another embodiment of drain programming voltage generation circuit 50. Transistor 187 of circuit 180 is a flash EPROM transistor. In contrast, transistor 167 in circuit 160 of FIG. 10 is a P-channel transistor. Flash EPROM transistor 187 also has its control gate connected to its floating gate, and the threshold voltage of the transistor does not change after fabrication.

Flash EPROM transistor 187 permits relatively accurate tracking of the variation of the effective channel length of flash EPROM cell 81. By replacing a P-channel transistor with a flash EPROM transistor 187, the $I_2$ current is also made to track the variation in the effective channel length of flash EPROM cell 81. This in turn causes the $V_{DP}$ voltage to more accurately track the effective channel length of flash EPROM cell 81.

For alternative embodiments, circuits 70, 130, 160, or 180 are used in configurations that maintain tight distributions of programming times and programmed threshold voltages from cell-to-cell within a single flash EPROM. For these alternative embodiments, different cells within a single flash EPROM are assigned different drain voltages dependent upon the programming ability of each respective memory cell.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory residing on a single substrate, comprising:
    (A) a memory array having at least a memory cell, wherein the memory cell includes a drain region, a source region, a control gate, and a floating gate;
    (B) a drain programming voltage generation circuit coupled to a programming voltage source and the drain region of the memory cell for providing a drain programming voltage to the drain region of the memory cell during programming of the memory cell;
    (C) a control circuit coupled to the drain programming voltage generation circuit for controlling the drain programming voltage generation circuit to cause the drain programming voltage to vary with respect to a programming ability of the memory cell such that the memory cell is programmed to be within a predetermined range of a predetermined threshold voltage with a predetermined gate programming voltage for a predetermined programming time, wherein the control circuit stores a control value that determines the voltage level of the drain programming voltage, wherein the voltage level of the drain programming voltage is changed by changing the control value in the control circuit, wherein the control value can be changed after the control value is set in the control circuit.

2. The nonvolatile memory of claim 1, wherein the drain programming voltage generation circuit further comprises a voltage setting circuit for setting the voltage level of the drain programming voltage in accordance with the control value, wherein voltage setting circuit is coupled to receive the control value from the control circuit.

3. The nonvolatile memory of claim 2, wherein the voltage setting circuit of the drain programming voltage generation circuit further comprises a plurality of transistors connected in parallel, wherein each of the plurality of transistors has a gate coupled to the control circuit, wherein the control circuit selectively turns on a particular combination of the plurality of transistors in accordance with the control value from the control circuit.

4. The nonvolatile memory of claim 3, further comprising
    (i) current mirror circuit coupled to the programming voltage source for providing a substantially constant first current;
    (ii) a source follower circuit coupled to (1) the programming voltage source, (2) the current mirror circuit, (3) the voltage setting circuit, and (4) an output of the drain programming voltage generation circuit for providing the first-current to the voltage setting circuit and for charging and settling the output node of the drain programming voltage generation circuit to the drain programming voltage, wherein the source follower circuit acts as a positive feedback loop to help the output node to be quickly charged to the drain programming voltage.

5. The nonvolatile memory of claim 1, wherein the memory cell is an electrically erasable and electrically programmable read only memory cell.

6. The nonvolatile memory of claim 1, wherein the memory cell can store a plurality of data bits at one time.

7. The nonvolatile memory of claim 1, wherein the predetermined range is approximately 1 volt.

8. A method for setting a drain programming voltage of a nonvolatile memory, comprising the steps of:
    (a) setting a first value corresponding to a first voltage level of the drain programming voltage;
    (b) sending the first value to a drain programming voltage generation circuit of the nonvolatile memory such that the drain programming voltage generation circuit generates the drain programming voltage in accordance with the first value;
    (c) selecting a plurality of memory cells of the nonvolatile memory for programming by applying the drain programming voltage to the selected plurality of memory cells for a predetermined programming time;
    (d) measuring a threshold voltage of one of the selected memory cells after programming;
    (e) comparing the threshold voltage measured with a predetermined programmed threshold voltage for the nonvolatile memory;
    (f) if the voltage level of the threshold voltage measured is not within a predetermined range of the predetermined programmed threshold voltage, then changing the drain programming voltage by changing the first value and repeating steps (b) through (e);
    (g) if the voltage level of the threshold voltage measured is within the predetermined range of the predetermined programmed threshold voltage, then storing the first value in the nonvolatile memory to constantly control the drain programming voltage generation circuit to generate the drain programming voltage in accordance with the first value such that the nonvolatile memory is programmed to the predetermined programmed threshold voltage within the predetermined programming time.

9. The method of claim 8, further comprising the step of selectively turning on a particular combination of the plurality of transistors of a voltage setting circuit of the drain programming voltage generation circuit in accordance with the first value such that the drain programming voltage generation circuit generates the drain programming voltage in accordance with the first value.

10. The method of claim 8 wherein the nonvolatile memory is an electrically erasable and electrically programmable read only memory.

11. The method of claim 8, wherein the predetermined range is approximately 1 volt.

12. A nonvolatile memory residing on a single substrate, comprising:
 (A) a memory array having at least a first memory transistor coupled to a bit line, wherein the first memory transistor includes a drain region coupled to the bit line, a source region, a control gate, and a floating gate, wherein the first memory transistor further includes an effective channel length:
 (B) a drain programming voltage generation circuit coupled to a programming voltage source and the bit line for providing a drain programming voltage to the drain region of the first memory transistor via the bit line during programming of the first memory transistor, wherein the drain programming voltage generation circuit further comprises
 (i) a voltage setting circuit for setting the voltage level of the drain programming voltage, wherein the voltage setting circuit further comprises a second memory, transistor that has an effective channel length substantially equal to that of the first memory, transistor of the memory, array such that the drain programming voltage generation circuit generates the drain programming voltage that also varies with respect to the effective channel length of the first memory transistor;
 (ii) a current mirror circuit coupled to the programming voltage source for providing a substantially constant first current;
 (iii) a source follower circuit coupled to (1) the programming voltage source, (2) the current mirror circuit, (3) the voltage setting circuit, and (4) an output of the drain programming voltage generation circuit for providing the first current to the voltage setting circuit and for charging and settling the output node of the drain programming voltage generation circuit to the drain programming voltage, wherein the source follower circuit acts as a positive feedback loop to help the output node to be quickly charged to the drain programming voltage.

13. The nonvolatile memory of claim 12, wherein the current mirror circuit further comprises a third memory transistor that has an effective channel length substantially equal to that of the first memory transistor of the memory array and that of the second memory transistor of the voltage setting circuit.

14. A nonvolatile memory, comprising:
 (A) a memory array having at least a first memory transistor coupled to a bit line, wherein the first memory transistor includes a drain region coupled to the bit line, a source region, a control gate, and a floating gate, wherein the first memory transistor further includes an effective channel length;
 (B) a drain programming voltage generation circuit coupled to a programming voltage source and the bit line for providing a drain programming voltage to the drain region of the first memory transistor via the bit line during programming of the first memory transistor, wherein the drain programming voltage generation circuit has a controllable resistance that varies in accordance with the effective channel length of the first memory transistor such that the drain programming voltage generation circuit generates the drain programming voltage that also varies with respect to the effective channel length of the first memory transistor, wherein the drain programming voltage generation circuit further comprises
 (i) a plurality of transistors connected in parallel for providing the controllable resistance, wherein the controllable resistance is selected by selectively turning on a particular combination of the plurality of transistors.

15. The nonvolatile memory of claim 14, further comprising a control circuit coupled to the drain programming voltage generation circuit, wherein each of the plurality of transistors has a gate coupled to the control circuit, wherein the control circuit selectively turns on a particular combination of the plurality of transistors in accordance with a control value stored in the control circuit.

16. The nonvolatile memory of claim 20, wherein the drain programming voltage generation circuit further comprises
 (ii) a current mirror circuit coupled to the programming voltage source for providing a substantially constant first current;
 (iii) a source follower circuit coupled to (1) the programming voltage source, (2) the current mirror circuit, (3) the plurality of transistors, and (4) an output of the drain programming voltage generation circuit for providing the first current to the plurality of transistors and for charging and settling the output node of the drain programming voltage generation circuit to the drain programming voltage, wherein the source follower circuit acts as a positive feedback loop to help the output node to be quickly charged to the drain programming voltage.

* * * * *

UNITED STATES PATENT AND TRADEMARK OFFICE
CERTIFICATE OF CORRECTION

PATENT NO. : 5,402,370
DATED : March 28, 1995
INVENTOR(S) : Fazio et al.

It is certified that error appears in the above-indentified patent and that said Letters Patent is hereby corrected as shown below:

In column 6, at line 3, delete "army" and substitute --array--

Signed and Sealed this

First Day of October, 1996

Attest:

BRUCE LEHMAN

Attesting Officer

Commissioner of Patents and Trademarks